United States Patent
Mulders (10) Patent No.: US 9,617,641 B2
(45) Date of Patent: Apr. 11, 2017

(54) AU-CONTAINING LAYER FOR CHARGED PARTICLE BEAM PROCESSING

(75) Inventor: Johannes Jacobus Lambertus Mulders, Eindhoven (NL)

(73) Assignee: FEI Company, Hillsboro, OR (US)

( * ) Notice: Subject to any disclaimer, the term of this patent is extended or adjusted under 35 U.S.C. 154(b) by 139 days.

(21) Appl. No.: 12/814,283

(22) Filed: Jun. 11, 2010

(65) Prior Publication Data

US 2010/0316811 A1    Dec. 16, 2010

(30) Foreign Application Priority Data

Jun. 12, 2009   (EP) ..................................... 09162532

(51) Int. Cl.
  *C23C 18/14* (2006.01)
  *C23C 18/08* (2006.01)

(52) U.S. Cl.
  CPC .............. *C23C 18/14* (2013.01); *C23C 18/08* (2013.01)

(58) Field of Classification Search
  None
  See application file for complete search history.

(56) References Cited

U.S. PATENT DOCUMENTS

| | | |
|---|---|---|
| 5,149,974 A | 9/1992 | Kirch et al. |
| 6,268,608 B1 | 7/2001 | Chandler |
| 6,753,538 B2 | 6/2004 | Musil et al. |
| 6,838,380 B2 | 1/2005 | Bassom et al. |
| 2004/0204785 A1* | 10/2004 | Richardson ........... B22F 3/1055 700/118 |
| 2008/0088831 A1 | 4/2008 | Mulders et al. |
| 2009/0152460 A1 | 6/2009 | Buhler et al. |
| 2010/0032302 A1 | 2/2010 | Holtermann et al. |
| 2010/0224592 A1 | 9/2010 | Toth et al. |

FOREIGN PATENT DOCUMENTS

| | | |
|---|---|---|
| EP | 0483517 | 5/1992 |
| EP | 2061068 | 5/2009 |
| JP | 05259095 A | * 10/1993 |

OTHER PUBLICATIONS

Pease (J. Vac. Sci. Technol. B 10, 278 (1992) p. 278-285).*
Berger (J. Vac. Sci. Technol. B 9 (1991) p. 2996-2999).*
(Continued)

*Primary Examiner* — Joel Horning
(74) *Attorney, Agent, or Firm* — Scheinberg & Associates, P.C.; Michael O. Scheinberg; John E. Hillert (57) ABSTRACT

The invention provides a method for providing an Au-containing layer onto a surface of a work piece, which method comprises:
  providing 510 a deposition fluid comprising Au(CO)Cl;
  depositing 520 the fluid on at least part of the surface of the work piece; and
  directing 530 a charged particle beam toward the surface of the work piece onto which at least part of the fluid is deposited to decompose Au(CO)Cl thereby forming the Au-containing layer on the surface of the work piece.
By using Au(CO)Cl as a precursor for charged particle induced deposition, a gold Au layer may be deposited with a very high purity compared to methods known in the art.

17 Claims, 5 Drawing Sheets

(56) References Cited

OTHER PUBLICATIONS

Molhave et al., Solid Gold Nanostructures Fabricated by Electron Beam Deposition, Nano Letters 2003, vol. 3, No. 11, 1499-1503, 2003.
Folch et al., Electron Beam Deposition of Gold Nanostructures in a Reactive Environment, Appl. Phys. Lett. 66 (16), Apr. 17, 1995, American Institute of Physics (4 pgs).
Gonzalez-Melendi, P., et al., "3-D gold in situ labelling in the EM," The Planet Journal, 2002, vol. 29(2), pp. 237-243.
Owen, et al, "Alignment of Electron Tomographic Series by Correlation without the use of Gold Particles," Ultramicroscopy, 1996, vol. 63, pp. 27-38.

\* cited by examiner

AU-CONTAINING LAYER FOR CHARGED PARTICLE BEAM PROCESSING

The present invention relates to a method and a system for providing an Au-containing layer onto a surface of a work piece.

Charged particles beams, such as ion beams and electron beams, are used for processing work pieces in nanotechnology because charged particle beams can form very small spots. For example, focused ion beam systems are able to image, mill, deposit, and analyze with sub-micron precision. Focused ion beam systems are commercially available, for example, from FEI Company, Hillsboro, Oreg., the assignee of the present application. The ions can be used to sputter, that is, physically eject, material from a work piece to produce features, such as trenches, in the work piece. Focused ion beams are often used in the semiconductor industry. In one application, for example, a focused ion beams is used to cut a small trench into an integrated circuit to expose a cross section of a vertical structure for observation or measurement using an ion beam or an electron beam.

An ion beam can also be used to form an image of the work piece, by collecting secondary particles ejected by the impact of the ion beam. The number of secondary particles ejected from each point on the surface is used to determine the brightness of the image at a corresponding point on the image.

In addition, charged-particle apparatus have a fast and well-defined patterning capability. For example, a mask may be provided to intersect the charged-beam, transferring a pattern on the mask to the charged-beam. By appropriate preparation of the work piece, the pattern can be transferred to the surface of the work piece where the charged-particle beam intersects the work piece. Alternatively, the charged-particle beam may be configured as a pencil beam and scanned over the work piece under computer control. By a combination of turning the beam on or off, and the amount of time the beam is kept on in one position (dwell time), patterns on the work piece may be created in different positions with different dimensions.

Electron beams can also be used to process a work piece. Electron beam processing is described, for example in U.S. Pat. No. 6,753,538 to Musil et al. for "Electron Beam Processing." Electron beams are more commonly used for forming images in a process called electron microscopy. Electron microscopy provides significantly higher resolution and greater depth of focus than optical microscopy. Scanning electron microscope (SEM), transmission electron microscope (TEM) and scanning transmission electron microscope (STEM) are some of the variants well known in the art.

A charged-particle beam can also be used to activate an etchant gas to enhance sputtering, or to decompose a precursor fluid to deposit material near the beam impact point. This is called ion beam induced deposition (IBID) for an ion particle beam and electron beam induced deposition (EBID) for an electron particle beam. EBID is a method of decomposing liquid or gaseous molecules by a focused electron beam leading to deposition of non-volatile fragments onto a nearby substrate. Said deposition occurs in high-vacuum chamber of an electron microscope and is therefore relatively free of contaminants. IBID differs from EBID that a focused ion beam is used instead of an electron beam. In both deposition methods, it is not the primary beam, but secondary particles which cause the deposition. Hence, the deposition occurs via a two-step process wherein a substrate, work piece or a material that has already been deposited near the deposition spot absorb primary electrons and re-emit secondary electrons that decompose the gaseous molecules.

In these deposition methods a wide range of materials can be deposited on a substrate or work piece for many purposes. Such materials include Al, Au, amorphous carbon, diamond-like carbon, Co, Cr, Cu, Fe, GaAs, GaN, Ge, Mo, Nb, Ni, Os, Pd, Pt, Rh, Ru, Re, Si, Si3N4, SiOx, TiOx, and W. The material selected to be deposited depends on the application, including the composition of the underlying target surface, and the intended purpose for the deposition.

Commonly used deposition gasses include precursor compounds that decompose to deposit W, Pt, and Au. For example, W-hexacarbonyl [CAS number 14040-11-0] can be used to deposit tungsten W, methylcyclopentadienyl Pt trimethyl [CAS number 1271-07-4] can be used to deposit platinum Pt, and dimethyl Au acetylacetonate [CAS number 14951-50-9] can be used to deposit gold Au. These precursor compounds have the drawback that they produce carbon contamination in the deposit.

Figure 4:
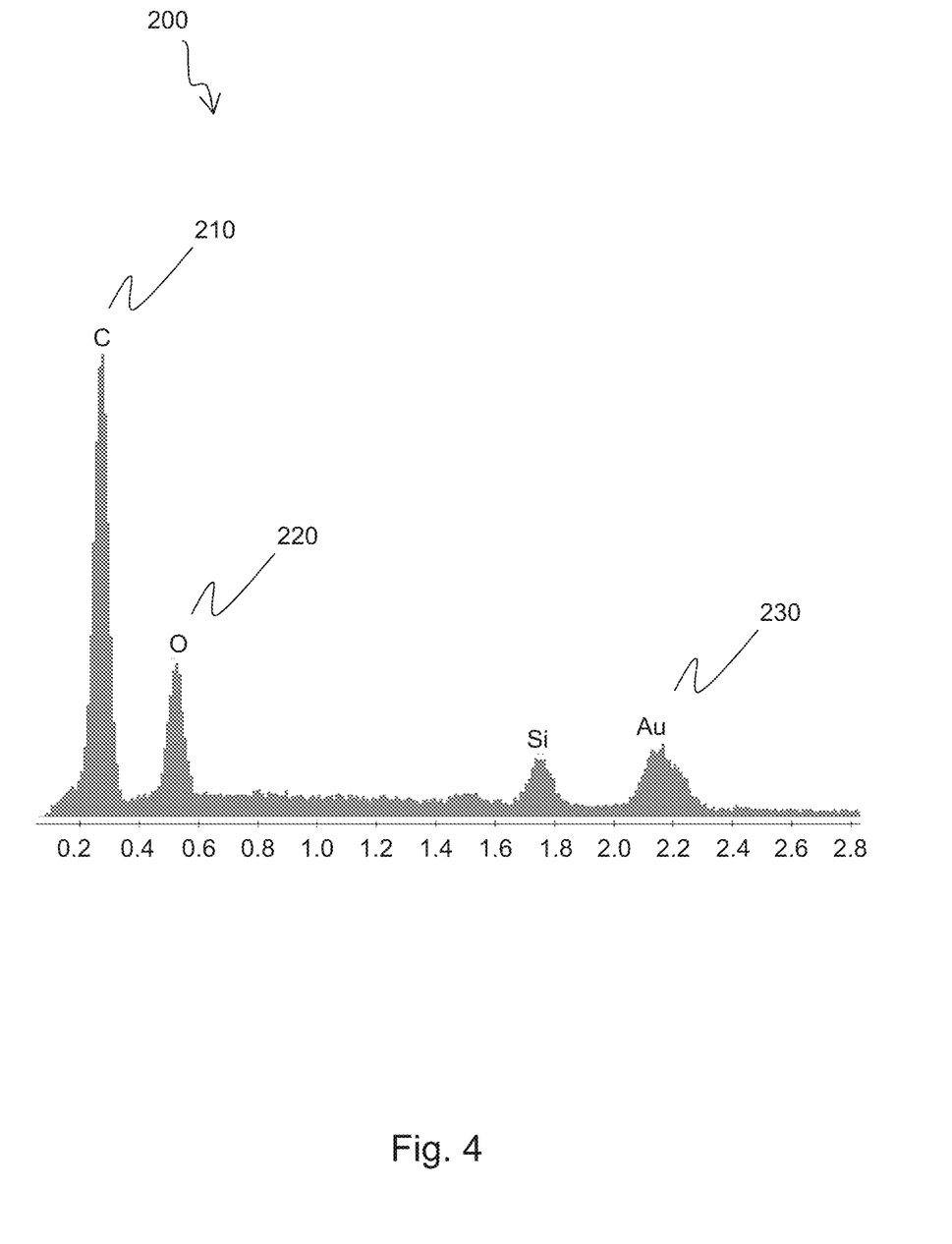
FIG. 4 depicts an EDX spectrum obtained from a Au deposit according to the prior art.

For example, with dimethyl Au acetylacetonate, it is generally observed that the deposited layer obtained only contains a relatively low amount of Au compared to the amount of carbon contaminants. FIG. 4 shows typical characterization graph 200 of a deposited Au layer using dimethyl Au acetylacetonate as a precursor. The elemental composition is characterized using an energy-dispersive X-ray spectroscope (EDX). The graph 200 indicates a range of 0-2.8 keV along the horizontal axis, and the number of counts along the vertical axis. Four peaks are depicted—for carbon C 210 between 0.2 and 0.4 keV, oxygen O 220 between 0.4 and 0.6, silicon Si between 1.6 and 1.8 and gold Au 230 between 2 and 2.2 keV. The height of the peaks indicate the number of counts, and FIG. 4 depicts a carbon C peak 210 of 73 mm, an oxygen O peak 220 of 24 mm, a silicon Si peak of 9 mm, and a gold Au peak 230 of 11.5 mm. The ratio of gold to carbon in the deposition is therefore 11.5:73 approximately, or 1:6.35 approximately. In other words, a small amount of gold (9 atom percent) and a large amount of carbon contamination (80 atom percent).

In light of the high cost of said compound and the low conductivity of the layer thus obtained, it will be understood that it is desirable to provide a deposition method for producing a layer containing a higher amount of Au relative to the amount of carbon contaminants.

The precursor material may be initially supplied as gas, liquid or solid. Liquid or solids are typically gasified prior to deposition, usually through vaporization or sublimation, and introduced as a fluid, at accurately controlled rate, into the system chamber. Alternatively, solid precursor may be sublimated by the irradiation using the charged beam.

Devices to deposit the fluid onto the surface of the work piece, so-called fluid or gas injection systems, are as such well-known, and a wide variety of such devices can be used in the present invention. Suitable fluid injection systems that can be used in accordance with the present invention have been described in FIGS. 3 and 4 of PCT application WO 00/22670 and the corresponding description.

An alternative fluid injection system which uses a cylinder through which the particle beam and the fluid passes is also suitable for use in the invention. An example is disclosed in U.S. Pat. No. 5,149,974.

As described above, the deposited material can be characterized using EDX, in which the specimen is bombarded with X-rays or a high energy beam of electrons or protons (Particle-Induced X-ray Emission or Proton Induced X-ray Emission—PIXE). Atomic interactions occur due to the bombardment, giving off EM radiation of wavelengths in the x-ray part of the electromagnetic spectrum specific to an element.

Alternatively, electron microscopy techniques may be used during or right after deposition. In situ electrical and optical characterization is also possible. For an ion-beam deposition system, an electron microscope may be integrated for the characterization. This is commonly called a dual beam system.

An object of the invention is to provide a system and method for providing an Au-containing layer onto a surface of a work piece.

Figure 2:
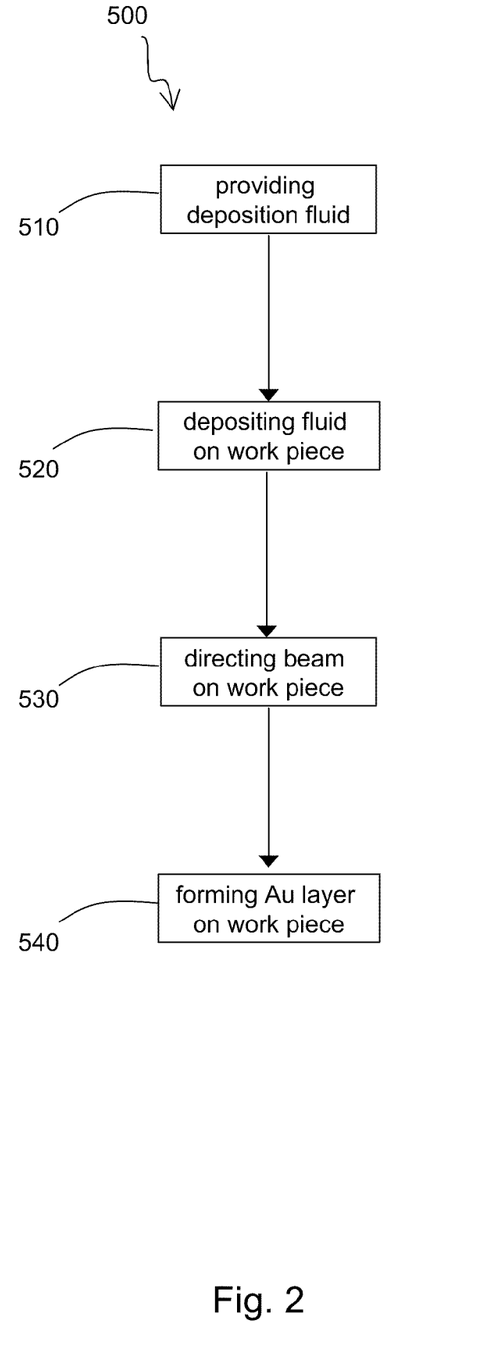
FIG. 2 depicts a method according to the invention.

Accordingly, the present invention relates to a method for providing an Au-containing layer onto a surface of a work piece, which method comprises:
- providing 510 a deposition fluid (vapour or gas) comprising Au(CO)Cl;
- depositing 520 the fluid on at least part of the surface of the work piece; and
- directing 530 a charged particle beam toward the surface of the work piece onto which at least part of the fluid is adsorbed to the surface, followed by beam induced decomposition of Au(CO)Cl thereby forming the Au-containing layer on the surface of the work piece.

Surprisingly when Au(CO)Cl is used as a precursor in accordance with the present invention, the Au-containing layer obtained contains a relatively high ratio of gold to carbon, indicating a low level of carbon contamination. This is much higher than would be expected based upon the Au:C ratio in the chemical formula of the precursor compound.

Suitably, in accordance with the present invention the deposition of the fluid is carried out under a reduced pressure. Preferably, the deposition is carried out under vacuum. More preferably, the deposition of the gas is carried out in the high-vacuum chamber of a charged-particle apparatus, such as an electron microscope.

By using a controlled environment, contamination can be reduced.

Preferably, the charged particle beam to be used in accordance with the present invention is an ion beam or an electron beam. More preferably, the charged particle beam to be used is an electron beam.

Charged particle beam systems are as such known, and a wide variety can be used in the present invention. Such an existing system may be modified by the skilled person to provide the system according to the invention.

It may be further advantageous to configure the charged particle beam to transfer a pattern to the surface in the Au-containing layer. This allows a pattern to be imparted to the deposited Au layer.

Advantageously, the charged particle beam is a pencil beam and the pattern is formed by scanning the pencil beam over the surface in a predetermined sequence. This provides a high degree of flexibility, and is particularly useful in the research field where it is uncommon to operate a deposition system with the same parameters and settings for each work piece.

The present invention also relates to the use of Au(CO)Cl as a precursor for electron beam-induced deposition (EBID) or ion beam-induced deposition (IBID).

Further, the present invention provides a reservoir for the delivery of a deposition fluid in a particle optical apparatus, wherein the reservoir comprises Au(CO)Cl.

A system according to the invention is provided, comprising:
- a work piece holder, configured to position the surface of a work piece at an irradiation position; a charged particle source, configured to provide a charged particle beam to the irradiation position; a fluid injector, configured to provide a deposition fluid comprising Au(CO)Cl to the irradiation position,
- wherein the charged particle beam and fluid injector are configured to decompose the deposition fluid, thereby forming the Au-containing layer on the surface of the work piece.

BRIEF DESCRIPTION OF THE DRAWINGS

These and other aspects of the invention are apparent from and will be elucidated with reference to the embodiments described hereinafter.

In the drawings.

The figures are purely diagrammatic and not drawn to scale. Particularly for clarity, some dimensions are exaggerated strongly. Similar components in the figures are denoted by the same reference numerals as much as possible.

SUMMARY OF THE INVENTION

Figure 1:
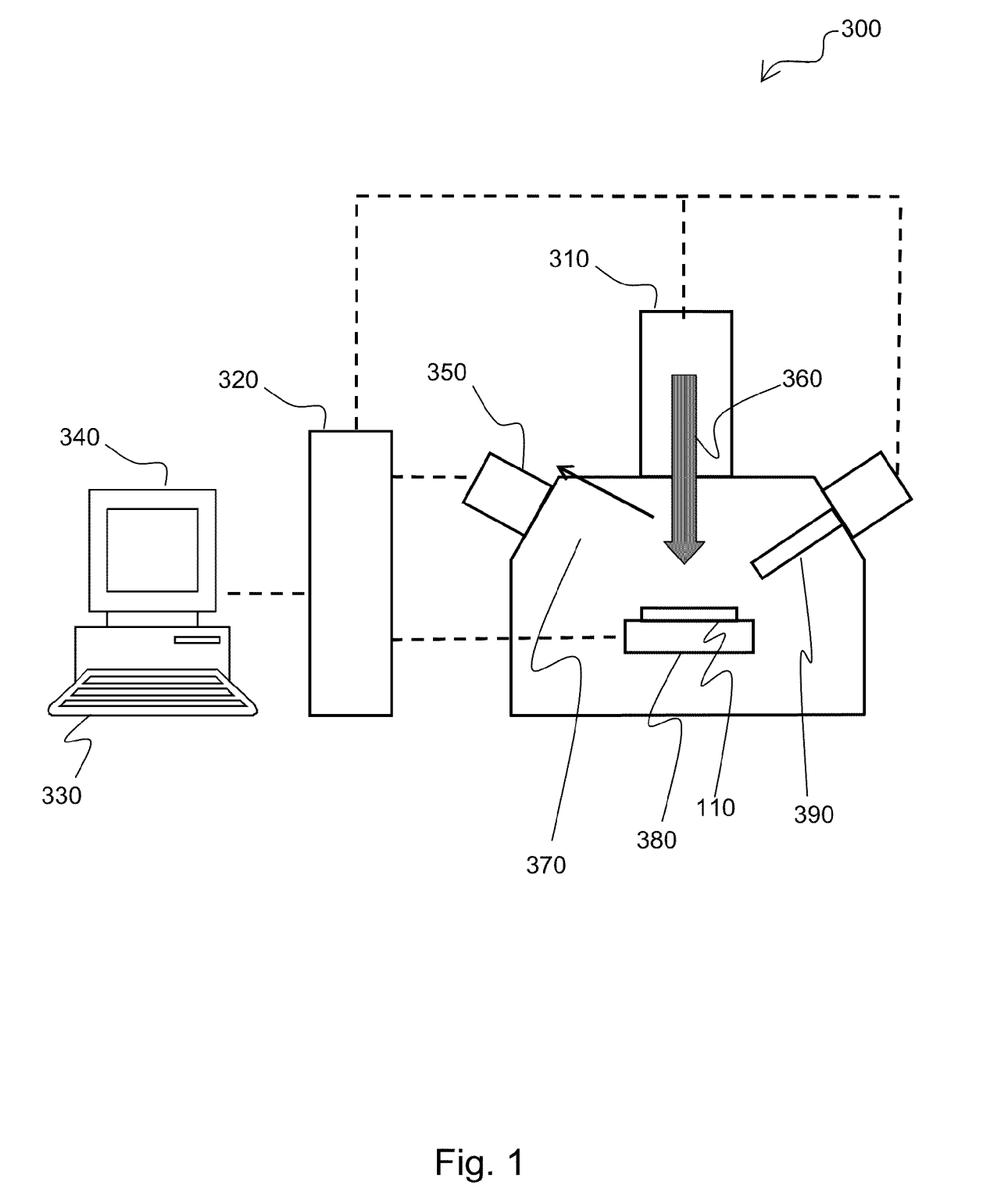
FIG. 1 shows a charged-particle beam system according to the invention.

In FIG. 1, a charged particle beam system 300 is schematically shown for use in the method of the present invention. The system 300 comprises:
- a charged particle source 310 generating a beam 360 so as to irradiate a work piece 110;
- a detector 350 for detecting irradiation of the work piece 110 by the beam, for example a detector of secondary electrons emitted from the work piece due to the impingement of an electron or ion beam. This may be used for characterization of the deposition during or after deposition. Alternatively, or in addition, the detector 350 may comprise an X-ray detector so that the EDX technique may be used for characterization in combination with an appropriate particle beam setting;
- a fluid injector 390 feeding a fluid, typically a gas, to the proximity of the work piece 110 surface;
- a work piece holder 380 for receiving and positioning the work piece 110;
- a control apparatus 320 to control the internal system environment, movement of the work piece holder 380, the charged particle beam source 310, the fluid injector 390, and to process signals from the detector 350;
- a user interface 330 for providing user input, and
- a display 340 for providing the user with visual information.

The work piece 110 to receive the Au-containing layer is selected depending on the application and purpose of the deposition. For example, semiconductor wafers of silicon, Si3N4, GaAs or Ge may be used. Other possibilities include biological samples, polymers, glass (SiO2) and ceramics.

The internal system environment is typically regulated in some way to reduce the risk of contamination and to reduce interaction between the charged particle beam and atmospheric gasses. For example, a reduced pressure may be used or even vacuum, vacuum levels being typically less than $10^{-5}$ mbar or better.

The fluid injector 390 typically comprises a control system to regulate the flow of the deposition gas, and one or more guides inside the system 300 to ensure that a desired partial pressure of deposition gas is achieved at the irradiation position. For example, a capillary tube having a small orifice is used to direct the gas towards the work piece. The point of delivery may be made adjustable by incorporating manipulators.

The further configuration of the fluid injector 390 depends upon the fluid or gas to be injected—it may comprise cooling and/or heating to achieve a certain temperature, it may comprise a reservoir for containing the deposition fluid or it may be in communication with a remote supply, it may comprise pressurization means to achieve a certain deposition gas pressure or flow rate.

The choice of precursor compound for injection depends mainly upon the material to be deposited. However, other important criteria include the ability to create a fluid form at reasonable temperatures, adequate adhesion of the deposited material to the work piece, stability at the fluidic temperature and the production of relatively few by-products.

The precursor according to the invention is Au(CO)Cl, also known as chlorocarbonyl gold or gold carbonyl chloride. It may be identified by its CAS number 50960-82-2 and it is available from a number of chemical suppliers such as Meryer Chemical (China), Leancare Ltd (UK), Service Chemical Inc (Germany) and Strem Chemicals, Inc (USA).

The Au(CO)Cl is typically supplied as a powder of 99% purity, which is heated prior to use. The heating is preferably done in the fluid injector 390, in close proximity to the point of injection.

In an exemplary embodiment, the charged particle beam is configured to transfer a pattern to the surface in the Au-containing layer. For example, the charged particle beam may be a pencil beam and the pattern is formed by scanning the pencil beam over the surface in a predetermined sequence. Alternatively, or in combination, a mask may be provided to intersect the charged particle beam, such that the intensity of charged particle beam is modulated in correspondence with a pattern on the mask.

The system 300 is configured such that the pattern transferred to the surface comprises four lines forming the outline of a square, each line having a linewidth of about 15 nm. The linewidth of the deposited lines mainly depends upon the defined line width in the pattern, and the settings of the system 300 such as the beam diameter and the dwell time during deposition. Additionally, line width is affected by the deposition conditions, such as the partial pressure of the precursor at the work piece and the beam energy. The thickness of the deposit onto the work piece 110 depends on the partial pressure of the precursor at the work piece, the beam energy and the dwell time during deposition. The partial pressure of the precursor at the work piece depends on the temperature of the precursor, the flow rate of the precursor fluid through the fluid injector 390, and the proximity of the injector 390 to the work piece.

In this exemplary embodiment, the beam current is selected to be in the range of 1 pA-20 nA. For example, it is approximately 1.6 nA with a 5 kV beam of electrons. The fluid injector 390 is positioned for example less than one mm, preferable approximately 200 µm, from the work piece 110, and the injection rate of $10^{14}$-$10^{18}$ molecules per second is selected to provide precursor fluid over several square millimeters of the work piece. The size of the area covered is not critical, but it will be obvious to the skilled person that fluid should be present on the work piece 110 in the area where the patterned beam 360 is to be provided.

The Au(CO)Cl precursor is added to the fluid injector 390 as a powder, and heated to 26 degrees C. The temperature is selected such that the precursor will flow when injected with the fluid injector 390, so a wide range of temperatures is possible. The work piece 110 is at approximately room temperature of 24 degrees C. The Au(CO)Cl is injected as a fluid using the injector 390 toward the surface of the work piece 110, and the electron beam 360 is directed toward the surface of the work piece 110 where the Au(CO)Cl fluid is present. By generating the four line pattern onto the fluid, the four line pattern in gold is deposited on the work piece 110.

Figure 3:
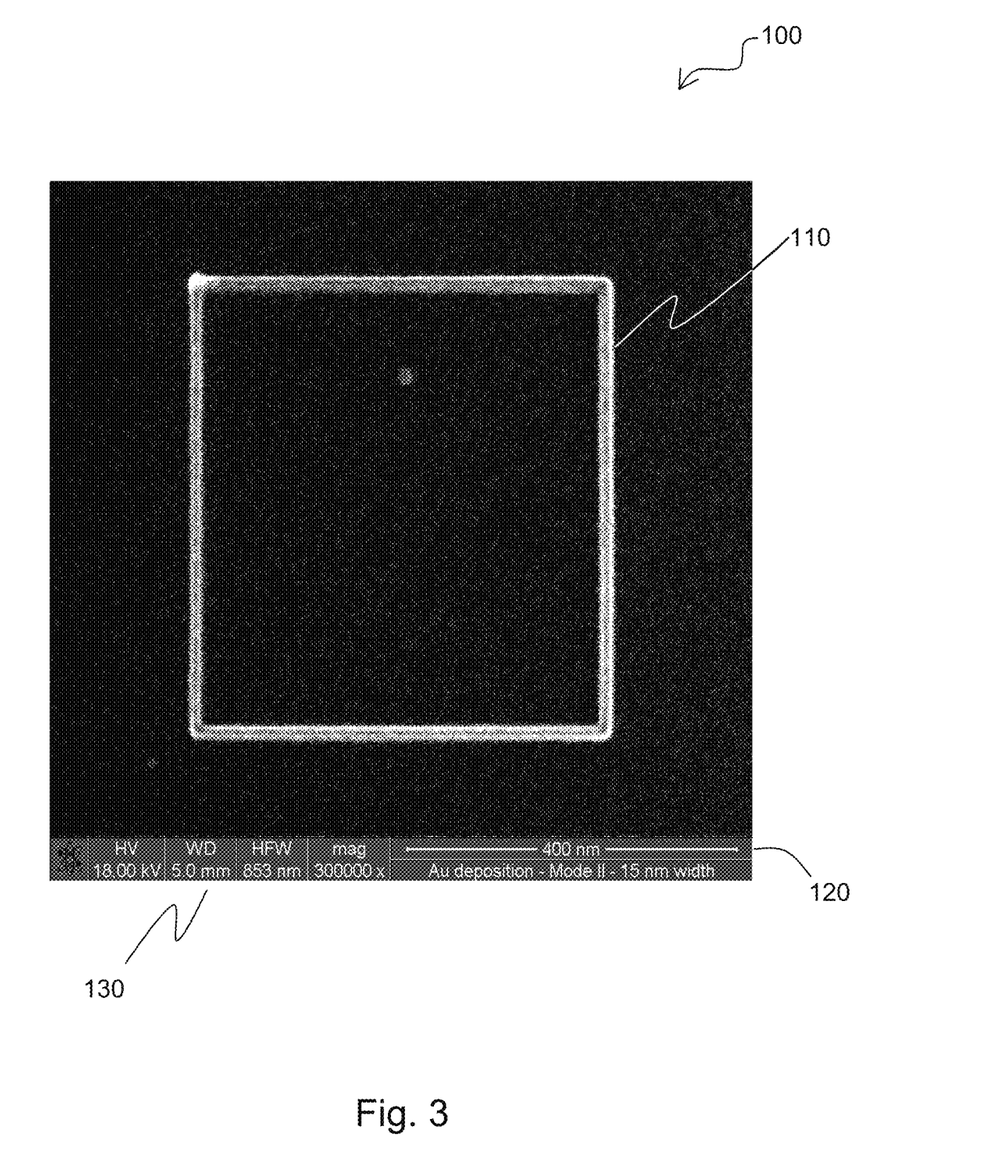
FIG. 3 depicts Au lines deposited using the invention.

FIG. 3 depicts a SEM image 100 of gold lines 110 on a silicon work piece 110, provided by this exemplary embodiment. The image 100 was taken using the settings 130 indicated on the image, namely with an 18 kV beam and a magnification of 300 000. The image 100 also comprises a scale 120 which corresponds to 400 nm, which makes the lines 110 approximately 15 nm wide.

The skilled person will be aware how to adapt the exemplary embodiment to produce line widths smaller than 10 nm, by adjusting one or more of the parameters indicated above.

Characterization of the deposition may be performed in-situ during or after deposition using the detector 350. Alternatively, the deposition may be characterized in a separate apparatus comprising the detector 350.

Figure 5:
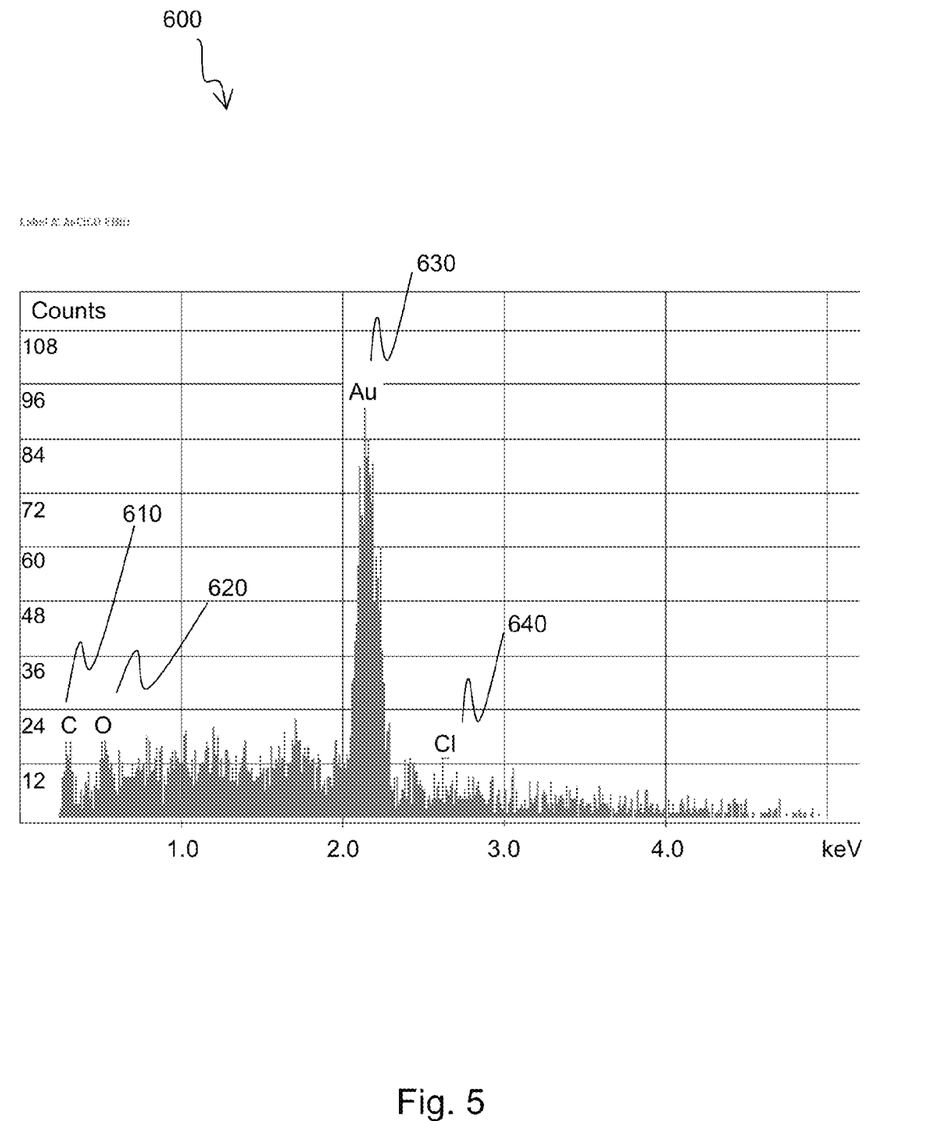
FIG. 5 depicts an EDX spectrum obtained from a Au deposit provided by the method and system of the invention.

FIG. 5 shows a characterization graph 600 of a deposited Au layer using Au(CO)Cl as a precursor in accordance with the exemplary embodiment. The elemental composition is characterized using a detector 350 comprising an energy-dispersive X-ray spectroscope (EDX) such as those available from EDAX. The electron beam 360 is set to 5 kV with a beam current of 0.3 nA, and this was used to scan as a SEM the deposited gold lines 110.

The graph 600 indicates a range of 0-5 keV along the horizontal axis, and the number of counts along the vertical axis. Four peaks are depicted—for carbon C 610 between 0 and 1 keV, oxygen O 620 between 0 and 1, gold Au 630 between 2 and 3 keV and chlorine Cl 640 between 2 and 3 keV. The height of the peaks indicate the number of counts, and FIG. 4 depicts a carbon C peak 610 of 20.5 mm, an oxygen O peak 620 of 20.5 mm, a gold Au peak 630 of 109.5 mm and a chlorine Cl peak 640 of 14 mm. The ratio of gold to carbon in the deposition is therefore 20.5:109.5 approximately, or 1:0.2 approximately. In other words, a large amount of gold (80 atom percent) and a small amount of carbon contamination (15 atom percent).

The graph 600 indicates a range of 0-5 keV along the horizontal axis, and the number of counts along the vertical axis. Four peaks are depicted—for carbon C 610 between 0 and 1 keV, oxygen O 620 between 0 and 1, gold Au 630 between 2 and 3 keV and chlorine Cl 640 between 2 and 3 keV. The height of the peaks indicates the number of counts, and FIG. 5 depicts a carbon C peak 610 of 20.5 mm, an oxygen O peak 620 of 20.5 mm, a gold Au peak 630 of 109.5 mm and a chlorine Cl peak 640 of 14 mm. The ratio of gold to carbon in the deposition is therefore 20.5:109.5 approximately, or 1:0.2 approximately. In other words, a large amount of gold (80 atom percent) and a small amount of carbon contamination (15 atom percent).

The skilled person using dimethyl Au acetylacetonate as a precursor would predict from the relative amounts of elements present in the chemical formula of this precursor, that the Au layer should comprise approximately 11 atom percent of gold Au. The results depicted in FIG. 4 and discussed above correspond approximately to the prediction.

A higher level of purity in the deposition means better conductivity, important in semiconductor applications. Also by immediately depositing a high level of purity, postprocessing techniques, such as annealing, to remove carbon contamination may be avoided, simplifying the overall production process.

The skilled person, provided with the details of the method disclosed, will be able to implement numerous systems for performing the methods, in addition to the systems disclosed in this application. Typically, such a system will comprise a computer, and the skilled person will be able to assign the function to a combination of hardware and software, and consequently implement a computer program to carry out these methods when loaded and run on the computer.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer.

The mere fact that certain measures are recited in mutually different dependent claims does not indicate that a combination of these measures cannot be used to advantage.

I claim as follows:

1. A method for providing an Au-containing layer onto a surface of a work piece, the method comprising:
   providing a deposition fluid comprising Au(CO)Cl;
   adsorbing the deposition fluid on at least part of the surface of the work piece; and
   directing a charged particle beam toward the surface of the work piece onto which at least part of the deposition fluid is deposited to decompose Au(CO)Cl, thereby forming the Au-containing layer on the surface of the work piece.

2. The method according to claim 1, wherein the deposition of the deposition fluid is carried out at a pressure of less than $10^{-5}$ mbar.

3. The method according to claim 1, wherein the deposition is carried out in a high-vacuum chamber.

4. The method according to claim 1, wherein the charged particle beam is an ion beam or an electron beam.

5. The method according to claim 1, wherein the charged particle beam is configured to transfer a pattern to the surface in the Au-containing layer.

6. The method according to claim 5, wherein the charged particle beam is a pencil beam and the pattern is formed by scanning the pencil beam over the surface in a predetermined sequence.

7. The method according to claim 5, wherein a mask is provided to intersect the charged particle beam, whereby an intensity of the charged particle beam is modulated in correspondence with a pattern on the mask.

8. The method according to claim 5, wherein the pattern transferred to the surface comprises features smaller than 100 nm.

9. The method according to claim 5, wherein the pattern transferred to the surface comprises features smaller than 50 nm.

10. The method according to claim 5, wherein the pattern transferred to the surface comprises features smaller than 10 nm.

11. The method according to claim 1, wherein forming the Au-containing layer on the surface of the work piece comprises forming an Au-containing layer comprising greater than or equal to 80 atomic percent Au.

12. A system for providing an Au-containing layer onto a surface of a work piece, the system comprising:
    a work piece holder, configured to position the surface of the work piece at an irradiation position;
    a charged particle source, configured to provide a charged particle beam to the irradiation position;
    Au(CO)Cl precursor;
    a fluid injector, configured to provide a deposition fluid comprising the Au(CO)Cl precursor to the irradiation position; and
    a computer loaded with a computer program that, when executed, directs the system to carry out a method of charged-particle-beam induced deposition that causes the formation of a layer of Au, wherein the method comprises:
      injecting the deposition fluid toward the irradiation position using the fluid injector, wherein the deposition fluid is provided to the irradiation position at a desired partial pressure;
      adsorbing at least part of the deposition fluid onto the surface of the work piece at the irradiation position; and
      decomposing the adsorbed Au(CO)Cl precursor by irradiating the work piece at the irradiation position with the charged particle beam.

13. The system according to claim 12, wherein the fluid injector comprises a reservoir containing the deposition fluid.

14. The system according to claim 12 further comprising a reservoir containing the Au(CO)Cl precursor.

15. The system according to claim 12, wherein the Au(CO)Cl precursor is a powder, wherein the fluid injector is configured to provide the deposition fluid to the irradiation position by injecting the deposition fluid toward the irradiation position, and wherein the fluid injector is configured to heat the powder to a temperature such that the Au(CO)Cl precursor will flow when deposition fluid is injected toward the irradiation position.

16. The system according to claim 15, wherein the fluid injector is positioned at a distance of less than 1 mm from the irradiation position.

17. The system according to claim 12, wherein computer program that, when executed, directs the system to carry out a method of electron beam induced deposition that causes the formation of a layer of greater than or equal to 80 atomic percent Au.

* * * * *